United States Patent [19]

Sakamoto et al.

[11] Patent Number: 5,138,643
[45] Date of Patent: Aug. 11, 1992

[54] EXPOSURE APPARATUS

[75] Inventors: Eiji Sakamoto, Sagamihara; Ryuichi Ebinuma, Kawasaki; Mitsuaki Amemiya, Atsugi; Shunichi Uzawa, Tokyo; Koji Uda, Yokohama, all of Japan

[73] Assignee: Canon Kabushiki Kaisha, Tokyo, Japan

[21] Appl. No.: 591,252

[22] Filed: Oct. 1, 1990

[30] Foreign Application Priority Data

Oct. 2, 1989 [JP] Japan .................. 1-255290
Jun. 19, 1990 [JP] Japan .................. 2-158693

[51] Int. Cl.⁵ .............................. G21K 5/00
[52] U.S. Cl. .............................. 378/34; 378/35; 73/40
[58] Field of Search .......... 378/34, 35, 119-121; 73/40, 40.5 R, 22; 355/30; 118/725

[56] References Cited

U.S. PATENT DOCUMENTS

| | | | |
|---|---|---|---|
| 4,194,233 | 3/1980 | Jones | 361/233 |
| 4,269,061 | 5/1981 | Hatsuno et al. | 73/40 |
| 4,383,178 | 5/1983 | Shibata et al. | 250/441.1 |
| 4,498,833 | 2/1985 | Hertel | 414/217 |
| 4,503,335 | 3/1985 | Takahashi | 250/548 |
| 4,516,254 | 5/1985 | Komeyama et al. | 378/34 |
| 4,736,763 | 4/1988 | Britton et al. | 73/40.5 R |
| 4,748,646 | 5/1988 | Osada et al. | 378/34 |
| 4,768,291 | 9/1988 | Palmer | 34/22 |
| 4,786,947 | 11/1988 | Kosugi et al. | 355/30 |
| 4,803,713 | 2/1989 | Fujii | 378/34 |
| 4,825,453 | 4/1989 | Kembo et al. | 378/34 |
| 4,852,133 | 7/1989 | Ikeda et al. | 378/34 |
| 4,888,488 | 12/1989 | Miyake | 250/492.1 |
| 4,900,938 | 2/1990 | Suzuki et al. | 250/442.2 |
| 4,901,751 | 2/1990 | Story et al. | 73/40 |
| 4,969,168 | 11/1990 | Sakamoto et al. | 378/34 |
| 4,981,103 | 1/1991 | Sekiguchi et al. | 118/725 |
| 5,063,582 | 11/1991 | Mori et al. | 378/34 |

FOREIGN PATENT DOCUMENTS

| | | |
|---|---|---|
| 0250064 | 12/1987 | European Pat. Off. . |
| 0260150 | 3/1988 | European Pat. Off. . |
| 0320297 | 6/1989 | European Pat. Off. . |
| 64-61700 | 3/1989 | Japan . |
| 1534450 | 12/1978 | United Kingdom . |

OTHER PUBLICATIONS

Okada, et al., "Development of Highly Reliable Synchrotron Radiation Lithography Beamline," J. Vac. Sci. Techol. B6(1), Jan./Feb. 1988, pp. 191 through 194.

Primary Examiner—Janice A. Howell
Assistant Examiner—Kim-Kwok Chu
Attorney, Agent, or Firm—Fitzpatrick, Cella, Harper & Scinto

[57] ABSTRACT

An exposure apparatus includes a chamber for placing an article in a predetermined ambience; a holding device for holding the article in the chamber; a fluid supplying device for supplying a temperature adjusting fluid into the holding device through a flow passageway; a detecting device for detecting leakage of the fluid from the flow passageway; and a flow rate controlling device for controlling the flow rate of the fluid to be supplied to the holding device on the basis of the detection by the detecting device.

9 Claims, 7 Drawing Sheets

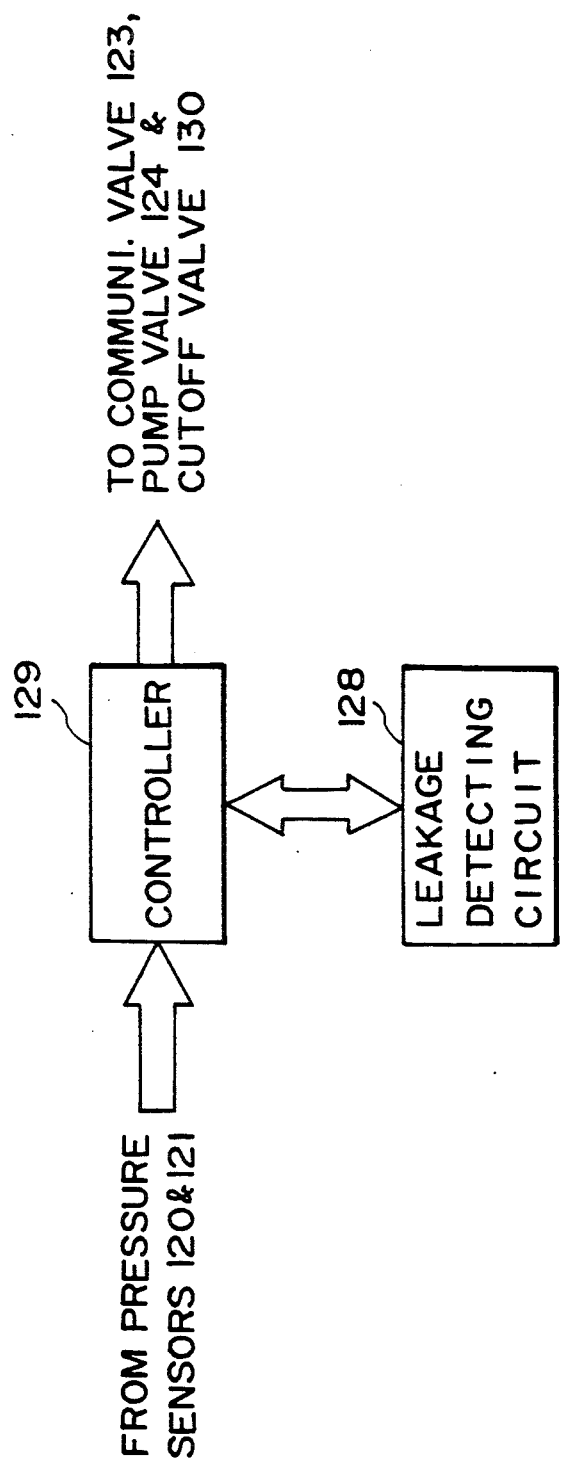
F I G. 2B

EXPOSURE APPARATUS

FIELD OF THE INVENTION AND RELATED ART

This invention relates to an exposure apparatus and, more particularly, to an X-ray exposure apparatus for exposing a semiconductor wafer by using a synchrotron radiation beam (hereinafter simply "SOR light").

As one of many semiconductor device manufacturing processes, there is an exposure process for printing a mask pattern on a wafer. In one case, this exposure process is executed in an ambience which is open to the atmosphere. In another case, it is executed in a closed casing. Particularly, in X-ray exposure apparatus in which X-rays are used as an exposure light source, the exposure process is executed in a vacuum or reduced pressure ambience so as to minimize the attenuation of the X-ray intensity. Thus, use of a closed casing is necessary. Where a reduced pressure ambience is to be provided in the closed casing, a gas of helium having a small X-ray absorbency is used.

In many cases, a flow passageway for temperature controlling water is provided in the closed casing container, so as to prevent deterioration of mechanical precision due to heat. In such a case, examples of the subject of temperature control are: a wafer chuck, conveyance actuators for a mask and a wafer, an electric circuit including a heat generating element, and the like.

Also, an X-ray exposure apparatus in which the exposure process is executed by using SOR light includes a synchrotron radiation device which produces the SOR light and which is held in an ultra-high vacuum state as well as an exposure chamber for accommodating therein a mask and a wafer, wherein the synchrotron radiation device is coupled to the exposure chamber through a beam line. The wafer accommodated in the exposure chamber is exposed with the SOR light having been passed along the beam line and having been partially blocked by the mask. In such an exposure process, heat is generated as a result of irradiation of the mask with the SOR light. In consideration thereof, the inside of the exposure chamber is filled with a gas ambience of a reduced pressure, reduced to such level by which necessary heat conduction occurs. The synchrotron radiation device is placed in an ultra-high vacuum state as described, and the respective pressure states of the synchrotron radiation device and the exposure chamber are retained by means of a window member which is provided across the beam line.

In the X-ray exposure apparatus of the structure such as described above, when leakage occurs at the beam line or when the window member is damaged due to leakage in the exposure chamber, there is a high possibility that the atmosphere enters into the synchrotron radiation device.

FIG. 6 shows an arrangement as disclosed in Japanese Laid-Open Patent Application, Laid-Open No. Sho 64-61700, which is adapted to prevent entrance of atmosphere into a synchrotron radiation device when such a leakage occurs.

In FIG. 6, SOR light 501 produced by a synchrotron radiation device (not shown) goes along a beam line 503 and through a window 507, provided in the beam line 503, and irradiates a mask 512 and a wafer 511, mounted to a wafer mount 517, both being accommodated in an exposure chamber 513. A temperature controlling water passageway 518 for removing heat, generated by the irradiation with the SOR light 501 as described, is embedded in the wafer mount 517. Temperature controlling water supply device 519 is provided outside the exposure chamber 513, and temperature controlling water whose temperature is stabilized at high precision by the temperature controlling water supply device 519 is circulated through the temperature controlling water passageway 518. While not shown in the drawing, the temperature controlling water passageway 518 extends through various heat generating portions in the exposure chamber 513, to prevent pattern misregistration between the mask 512 and the wafer 511 due to thermal distortion.

Along the beam line 503, there are provided, in the named order, a shock wave delay tube 504 for retarding the propagation of shock waves generated by vacuum leakage as well as a mirror chamber 505 for expanding the SOR light 501. Pressure sensor 506 is disposed between the mirror chamber 505 and a window member 507, while an emergency shutoff valve 502 which is operable in accordance with the pressure detected by the pressure sensor 506, is provided between the synchrotron radiation device and the shock wave delay tube 504. The mask 515 and the wafer 511 accommodated in the exposure chamber 513 can be replaced by another mask 515, accommodated in a mask pre-chamber 516, and another wafer 511, accommodated in a wafer pre-chamber 509, through gate valves 514 and 510, respectively.

If leakage occurs at the beam line 503 or the window 507 is damaged due to leakage in the exposure chamber 513, the pressure as detected by the pressure sensor 512 increases accordingly and the emergency shutoff valve 502 is closed to prevent entrance of atmosphere into the synchrotron radiation producing device.

SUMMARY OF THE INVENTION

It is possible that water leakage occurs in a closed casing of an X-ray exposure apparatus and, if this occurs, there are caused inconveniences such as: (1) the X-ray intensity is attenuated by the water vapor, (2) by the water vapor, the mask swells, resulting in deterioration of the pattern precision, (3) the electric circuit is damaged, and the like. Further, if the water leakage grows to break the flow passageway, the exposure apparatus itself is damaged considerably.

It is accordingly an object of the present invention to provide an X-ray exposure apparatus by which any water leakage in a closed casing can be detected at an early stage, such that deterioration of the apparatus function can be minimized.

This object can be achieved in the present invention by providing, in a closed casing for execution of the exposure process, means for detecting a water content or moisture of a gas in the closed casing.

If water leakage occurs in the closed casing, the water content of the ambience in the container increases. Thus, by detecting the water content in the casing, it is possible to detect the water leakage.

In another aspect, conventional X-ray exposure apparatuses are equipped with a pressure sensor for detecting any abnormal pressure, which sensor is provided at the synchrotron radiation device side (upstream side) of the window member. Thus, any leakage which occurs at the exposure chamber can be detected after the window is broken. However, if the window is broken, many fractions thereof scatter into the exposure chamber and the beam line. Therefore, very complicated devices are required to restore the apparatus and, thus, a long time is necessary until the exposure operation can be re-started. Such a problem arises not only in the case of leakage at the chamber but also in the case of leakage of temperature controlling water. This is because, since the inside of the exposure chamber is held at a reduced pressure, the collection of leaked temperature controlling water in the exposure chamber or the volume expansion as the leaked temperature controlling water is vaporized, causes a pressure increase in the exposure chamber.

It is accordingly a second object of the present invention to provide an X-ray exposure apparatus in which, if leakage occurs at the exposure chamber or if leakage of temperature controlling water occurs, the synchrotron radiation device can be protected without damage to the window member.

In accordance with an aspect of the present invention, to achieve this object, there is provided a combination for use in an X-ray exposure apparatus having a synchrotron radiation device for producing a synchrotron radiation beam and an exposure chamber coupled to said synchrotron radiation device through a beam line, wherein the synchrotron radiation beam is inputted to said exposure chamber through a window provided across said beam line, for execution of an exposure process in said exposure chamber and wherein a temperature controlling water passageway for temperature control is provided adjacent a heat generating portion of said exposure chamber, the combination comprising: pressure detecting means for detecting pressure in said exposure chamber; a shutoff valve provided in a portion of said beam line between said window and said synchrotron radiation device; bypass means having a communication valve for communicating a portion of said beam line between said window and said shutoff valve with another portion of said beam line between said window and said exposure chamber; vacuum-evacuating means for vacuum-evacuating a portion of said beam line between said window and said shutoff valve; a pump valve provided in a passageway which communicates said beam line with said vacuum-evacuating means; a leakage sensor for detecting leakage at said temperature controlling water passageway; and a control device operable in response to the pressure detected by said pressure detecting means so that, when the detected pressure in the exposure process is at a steady state level lower than a predetermined pressure, said control device operates to open said shutoff valve and said pump valve and to close said communication valve while, when the detected pressure in the exposure process is higher than said predetermined pressure or when said leakage sensor detects the leakage, said control device operates to close said shutoff valve and said pump valve and then to open said communication valve.

In this case, a second shutoff valve which can be controlled between an open state and a closed state like the shut-off valve provided in the portion of the beam line between the window and the synchrotron radiation device, may be provided in a portion of the beam line between the window and the exposure chamber.

Also, the structure may be modified so as to include only the shutoff valve provided in a portion of the beam line between the window and the exposure chamber, as well as an associated control device.

If, during the exposure process, leakage occurs at the exposure chamber and the detected pressure rises beyond a predetermined pressure or, alternatively, if water leakage causing pressure rise occurs, the shutoff valve and the pump valve are closed and, thereafter, the communication valve is opened. Since the shutoff valve is closed before the communication valve is opened, the gas in the exposure chamber does not enter into the synchrotron radiation device. Since the opening of the communication valve is effective to avoid application of pressure to the window member, there is no possibility of breakage of the window member. Additionally, vacuum-evacuating means is provided to vacuum-evacuate a predetermined portion of the beam line. When the exposure process is to be re-started, the communication valve is closed and, thereafter, the pump valve is opened to discharge, through vacuum, the gas of the exposure chamber having been entered into the portion between the window and the shutoff valve. After this, the shutoff valve is opened. This effectively prevents entrance of the gas of the exposure chamber into the synchrotron radiation device, like the case when the shutoff valve is closed.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 2B is a schematic view, illustrating the state of coupling a control device 129 of the FIG. 2A embodiment.

DESCRIPTION OF THE PREFERRED EMBODIMENTS

Figure 1:
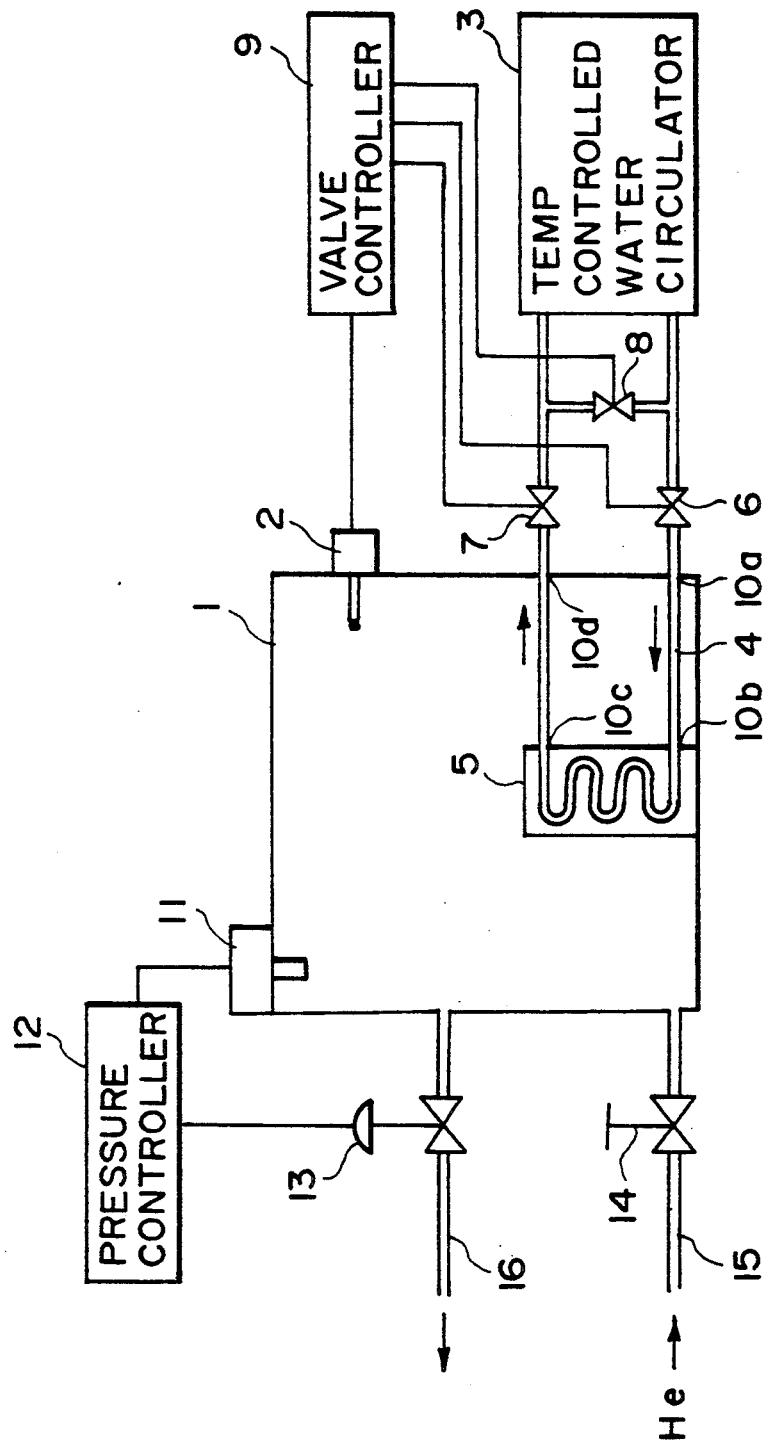
FIG. 1 is a schematic and diagrammatic view of an X-ray exposure apparatus according to an embodiment of the present invention.

Referring to FIG. 1, a first embodiment of the present invention will be explained. Denoted at 1 is a closed casing (gastight casing) for execution of an exposure process to a mask and a wafer with SOR light. The casing 1 is adapted to hold the mask and the wafer in a desired ambience such as a reduced pressure gas ambience of helium, for example. Denoted at 2 is a water content detecting sensor for detecting the water content or moisture of the gas within the closed casing 1. In this embodiment, it comprises a hygrometer for measuring the relative humidity, for example. Denoted at 3 is a temperature controlling water circulating device, for supplying into the closed casing 1 water having been adjusted to a desired constant temperature. Denoted at 4 is a flow passageway for the temperature controlling water, from the temperature controlling water circulating device 3. Denoted at 5 is one subject of temperature control, which is a water chuck in this example for holding water at the exposure station. Denoted at 6, 7 and 8 are valves, respectively, which are provided in relation to the flow passageway 4. Denoted at 9 is a controller for controlling the opening/closing of each of the valves 6, 7 and 8 in response to a signal from the hygrometer 2. Reference characters $10a-10d$ denote conjunctions of the flow passageway 4, at which there is a possibility of water leakage. Denoted at 11 is a pressure gauge; at 12 is a pressure controller; at 13 is a flow rate control valve; at 14 is a needle valve; at 15 is a gas introducing pipe; and at 16 is a gas discharging pipe. The mechanical structures related to the exposure process itself are not shown in the drawing. A gas of helium is supplied into the closed casing 1 through the gas introducing pipe 15, and the inside of the casing is controlled to a pressure of about 10 (torr) by means of the pressure gauge 11, the pressure controller 12 and the flow rate control valve 13. The humidity is zero (0) %. By means of the temperature controlling water circulating device 3, the temperature controlling water is circulated through the subject of temperature control, denoted at 5. Usually, each of the valves 6 and 7 is held in the open state, while the valve 8 is held in the closed state.

If water leakage occurs in the closed casing 1, since the saturated water vapor pressure at a normal temperature is about 20 (torr), the water is immediately vaporized and the humidity in the casing 1 increases. Here, the water content detecting sensor 2 (hygrometer) provided in the closed casing 1 for detection of the water content of the gas within the casing 1, detects the increase in humidity due to the water leakage. In response thereto, the controller 9 operates to close the valves 6 and 7 and to open the valve 8, whereby the water supply to the subject of temperature control, denoted at 5, is interrupted. By this, it is possible to minimize the damage of the exposure apparatus due to the water leakage from the flow passageway 4.

Next, another embodiment of the present invention will be explained. In this embodiment, with a structure similar to that of the first embodiment, the closed casing 1 is maintained at an inside pressure of 200 (torr). Also, in this embodiment, the water content detecting sensor 2 for detecting the water content of the gas within the casing 1 comprises a moisture meter which is a hygrometer having higher precision. Since the pressure inside the casing 1 is higher than the saturated water vapor pressure, if there occurs water leakage from the flow passageway 4, the vaporization speed of the water is low as compared with that in the first embodiment. However, by using a moisture meter having a higher resolution of water content detection, it is possible to detect the water leakage in the casing at an early stage.

In accordance with this aspect of the present invention, as described hereinbefore, an X-ray exposure apparatus is equipped with means for detecting the water content (moisture) of the gas within a closed casing for execution of the exposure process, by which it is possible to detect any water leakage in the closed casing. As a result, it is possible to avoid considerable damage of the exposure apparatus.

Figure 2A:
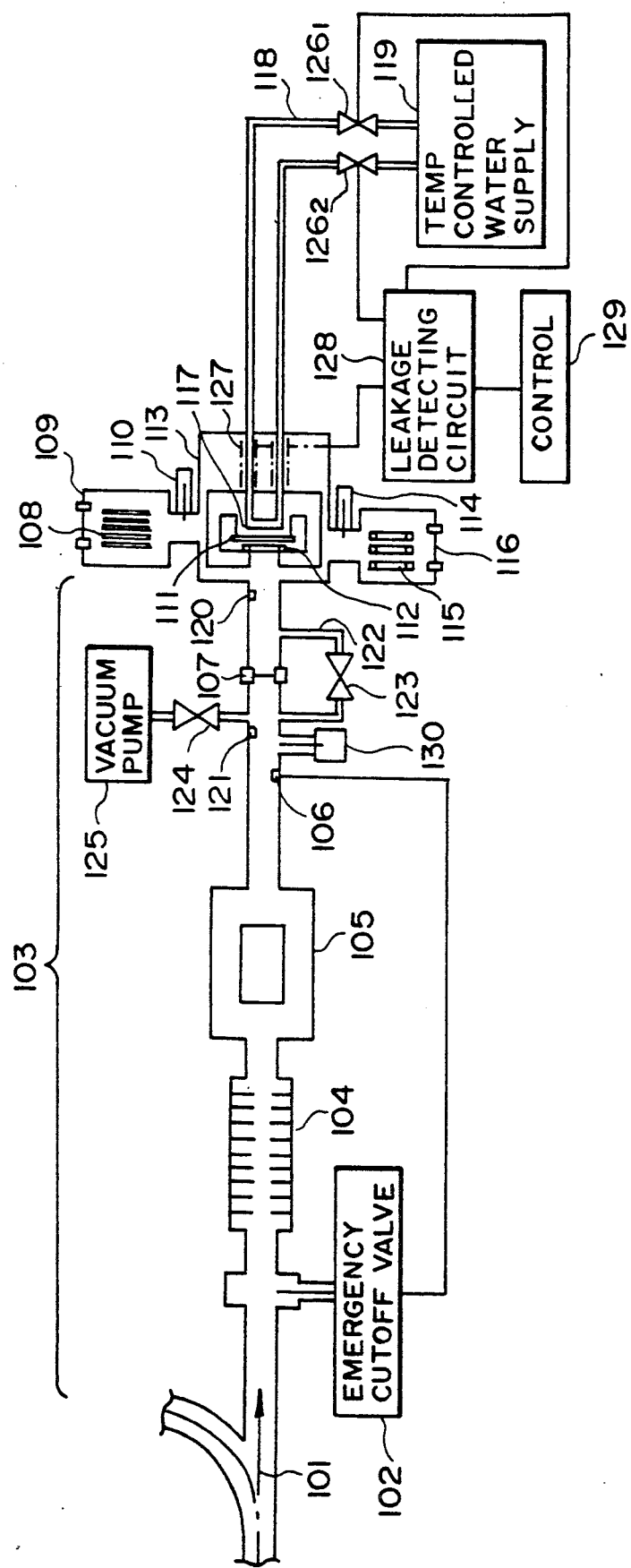
FIG. 2A is a schematic and diagrammatic view of an X-ray exposure apparatus according to another embodiment of the present invention.

Referring to FIG. 2A, another embodiment of the present invention will be explained.

In FIG. 2A, SOR light 101 produced by a synchrotron radiation device (not shown) goes along a beam line 103 and through a window member 107, provided across the beam line 103, and irradiates a mask 112 and a wafer 111, mounted to a wafer mount 117, both being accommodated in an exposure chamber 113. Temperature controlling water passageway 118 for removing heat generated as a result of irradiation with the SOR light 101 as described, is embedded in the water mount 117. Temperature controlling water supply device 119 is provided outside the exposure chamber 113, and temperature controlling water whose temperature is stabilized at high precision by the temperature controlling water supply device 119 is circulated through the temperature controlling water passageway 118. While not shown in the drawing, the temperature controlling water passageway 118 extends through various heat generating portions within the exposure chamber 113, so as to prevent pattern misregistration between the mask 112 and the wafer 111 due to thermal distortion.

Along the beam line 103, there are provided in the named order a shock wave delay tube 104 for retarding the propagation of shock waves to be caused by vacuum leakage, as well as a mirror chamber 105 for expanding the SOR light 101. Pressure sensor 106 is disposed between the mirror chamber 105 and a window member 107, while an emergency shutoff valve 102 operable in accordance with the pressure detected by the pressure sensor 106, is disposed between the synchrotron radiation device and the shock wave delay tube 104. The mask 115 and the wafer 111 accommodated in the exposure chamber 113 can be replaced by another mask 115, accommodated in a mask pre-chamber 116, and another wafer 111 accommodated in a wafer pre-chamber 109, through gate valves 114 and 110, respectively.

If vacuum leakage occurs at the beam line 103 or a leakage occurs at the exposure chamber 113 and, as a result, the window member 107 is broken, the pressure as detected by the pressure sensor 112 increases and, in response, the emergency shutoff valve 102 is closed to prevent entrance of atmosphere into the synchrotron radiation producing device.

In addition to the above-described components, the beam line 103 of the present embodiment is equipped with a pressure sensor (pressure detecting means) 120 for detecting the pressure within the exposure chamber 113, another pressure sensor 121, a shutoff valve 130 for intercepting between the mirror chamber 105 and the window member 107, a bypass passageway 122 for bypassing the window member 107, from the portion between the shutoff valve 130 and the window 107 to the exposure chamber 113, a communication valve 123 for controlling the opening/closing by the bypass passageway 122, and a vacuum pump 125 for vacuum-evacuating the portion between the window 107 and the shutoff valve 130, through a pump valve (openable and closable valve) 124. The pressure sensor 120 is disposed between the window 107 and the exposure chamber 113, while the pressure sensor 121 is disposed between the window 107 and the shutoff valve 130. Additionally, a water leakage sensor 127 is mounted to a major part of the temperature controlling water passageway 118 in the exposure chamber 113. Also, two flow passageway shutoff valves $126_1$ and $126_2$, for interrupting circulation of the temperature controlling water, are provided at the inlet and outlet portions of the temperature controlling water supply device 119 for the temperature controlling water passageway 118. Outside the beam line 103 and the exposure chamber 113 of the structure described above, there are provided a water leakage detecting circuit 128, communicated with the water leakage sensor 127 and the flow passageway shutoff valve $126_1$ and $126_2$, as well as an associated control device 129. The control device 129 communicates with the water leakage detecting circuit 128 and, additionally, it communicates with the pressure sensors 120 and 121, the communication valve 123, the pump valve 124 and the shutoff valve 130, through respective communication lines, not shown in FIG. 2A. The control device 129 is operable to control the operations of the shutoff valve 130, the communication valve 123, the pump valve 124 and the flow passage shutoff valves $126_1$ and $126_2$, in accordance with the pressure detected by a corresponding pressure sensor or in accordance with the detection by the water leakage sensor 127. Also, the control device is communicated with a display device (not shown) for control of the display operation of the same.

FIG. 2B is a block diagram, schematically showing the communication of the control device 129 with the water leakage detecting circuit 128, the pressure sensors 120 and 121, the communication valve 123, the pump valve 124 and the shutoff valve 130.

Figure 3:
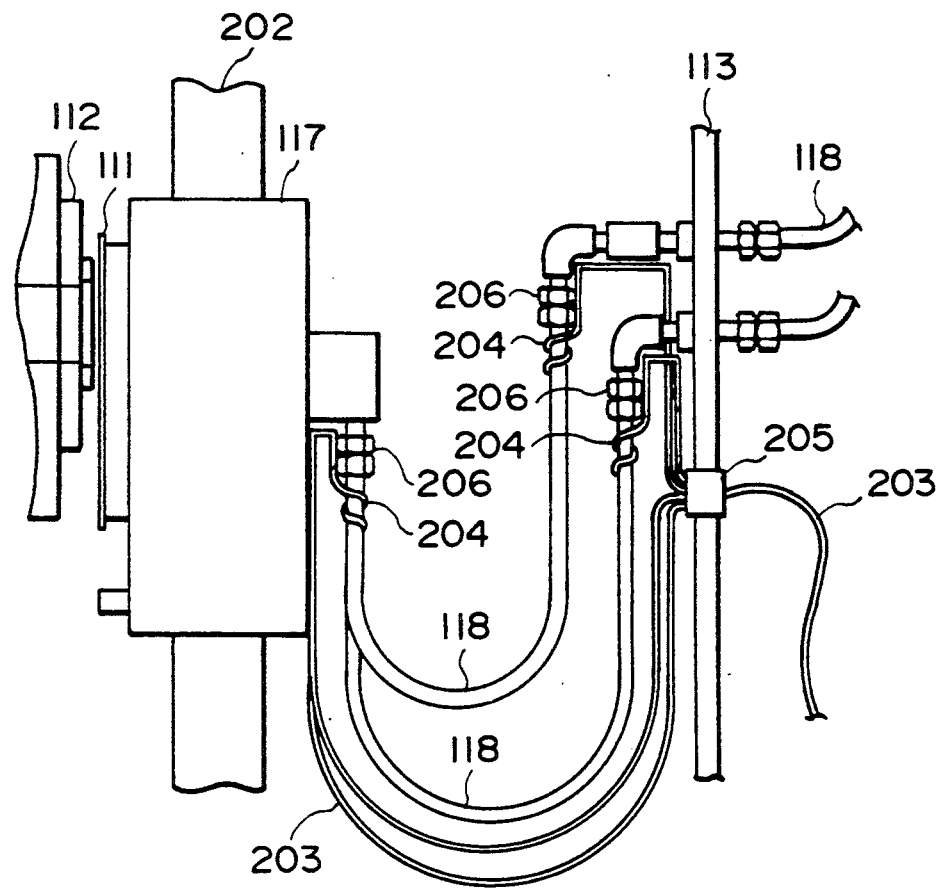
FIG. 3 is a fragmentary view, illustrating the structure of a water leakage sensor 127 of the FIG. 2A embodiment.

FIG. 3 illustrates details of the water leakage sensor 127 mounted to the temperature controlling water passageway 118 within the exposure chamber 113.

The water leakage sensor 127 used in this embodiment comprises a sensor of the type in which the water leakage is detectable from a change in resistance between electrodes.

The wafer mount 117 to which the wafer 111 is mounted, is movable upwardly and downwardly as viewed in FIG. 3, along a guide 202. The wafer mount 117 is coupled to the temperature controlling water passageway 118 through a connector 206, such that the temperature controlling water is circulated through the inside of the water mount. Electrode means 204 to be used as the water leakage sensor 127, comprises a pair of wire-like electrodes disposed parallel to each other. These electrode elements are accommodated in a sensor cable 203 extending into the exposure chamber 113 through a hermetic connector 205, and they extend to a plurality of water leakage detecting points in a parallel relationship or in a series relationship. The water leakage detecting points are set in the neighborhood of the connector 206. This is because of a high possibility of water leakage due to loosening of the connector 206, resulting from motion of the wafer mount 117. If water leakage occurs at any of the water leakage detecting points, the resistance between the electrodes 204 decreases. Thus, on the basis of a change in the resistance, it is possible to detect the water leakage.

The wafer 111 accommodated in the exposure chamber 113 is exposed with the SOR light 101 having been passed through the beam line 103 and the window 107 and having been partially blocked by the mask 112. During such an exposure process, as described, heat is generated in the mask 112 as a result of irradiation of the same with the SOR light 101. In consideration thereof, the exposure chamber 113 is filled with a gas ambience of reduced pressure (for example, He gas of 150 torr), reduced to such a level at which necessary heat conduction is allowed. Also, for good transmission of the SOR light 101, the window member 107 comprises a thin film of beryllium (10-20 micron thickness). The inside pressure $P_S$ (150 torr) in the exposure chamber 113 is set to be lower than the proof pressure $P_L$ of the window material 107 at that thickness.

Figure 6:
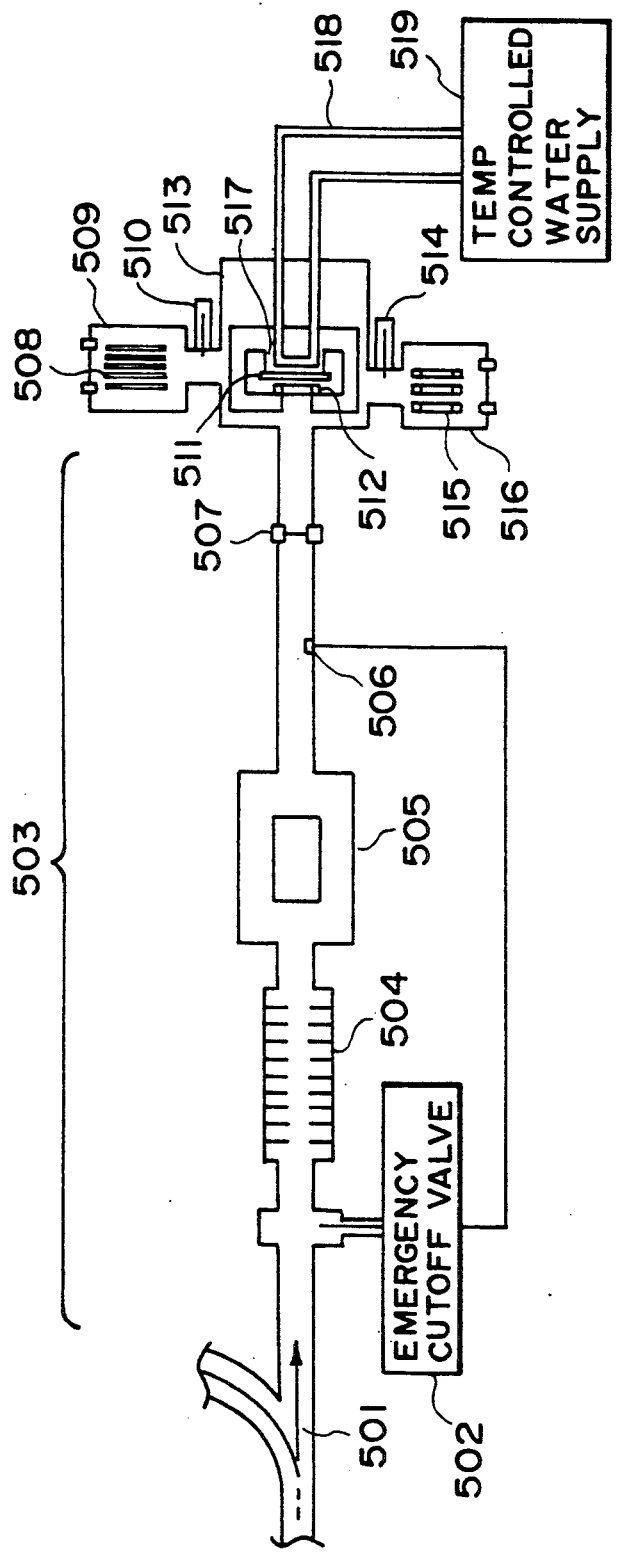
FIG. 6 is a schematic view of an X-ray exposure apparatus of known type.

Like the known example shown in FIG. 6, when the mask 112 and the wafer 111 to be used for the exposure are going to be replaced by a mask 115 and a wafer 108 accommodated in the mask pre-chamber 116 and the wafer pre-chamber 109, respectively, both the wafer pre-chamber 109 and the mask pre-chamber 116 are rendered into what can be called a "load-locked state" in which the inside is replaced by a similar ambience as in the exposure chamber 113.

While not shown in the drawings, each of the exposure chamber 113, the wafer pre-chamber 109 and the mask pre-chamber 116 is equipped with a vacuum-evacuating means and a gas introducing means, for attaining such inside ambience as described, and pressure adjustment is executed. All of these vacuum-evacuating means and gas introducing means are controlled by the control device 129.

In a normal state of an exposure process, the emergency shutoff valve 102, the shutoff valve 130 and the pump valve 124 are all held at the open state, while the communication valve 123 is held at the closed state. Thus, also the vacuum pump 125 is contributable to provide a vacuum in the beam line 103.

If, during the exposure process, vacuum leakage occurs at the beam line 103, it is detected by the pressure sensor 106 like the conventional example of FIG. 6, and the emergency shutoff valve 102 is closed to protect the synchrotron radiation device. Also, the detection of pressure leakage or water leakage related to the exposure chamber 113 as well as the protection of the window member 107 against such leakage, are executed under the control of the control device 129.

Figures 4A, 4B:
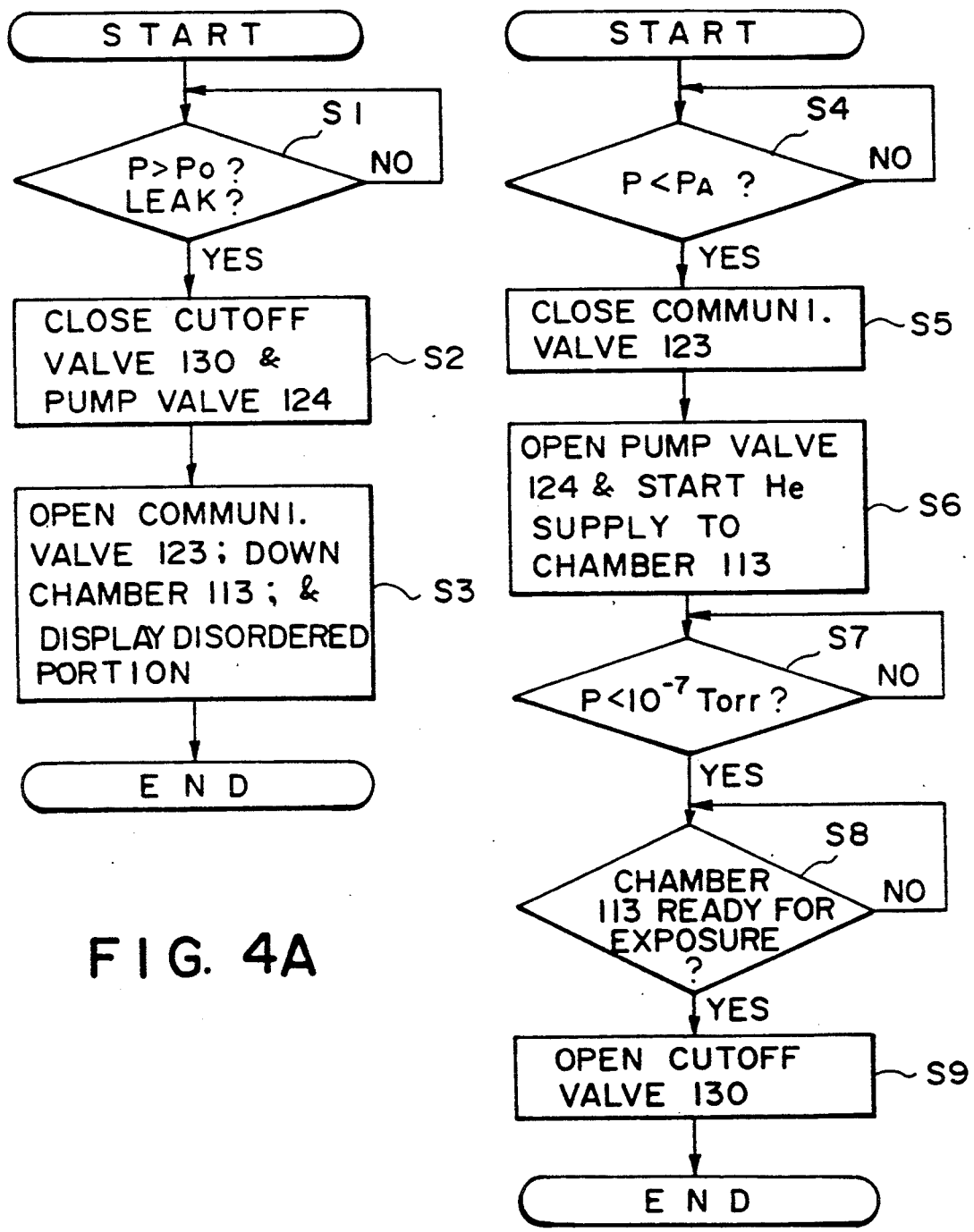
FIGS. 4A and 4B are flow charts, respectively, each showing the operation of the control device 129.

FIG. 4A is a flow chart showing the operation of the control device 129 during the exposure process.

In the exposure process, the control device 129 continuously monitors whether the inside pressure P of the exposure chamber 113 as detected by the pressure sensor 120 is higher than a predetermined pressure $P_O$ or not ($P_S < P_O < P_L$ wherein $P_S$ is the inside pressure of the chamber 113 at the time of exposure and $P_L$ is the proof pressure of the window member 107) and, additionally, it continuously monitors whether water leakage is detected by the water leakage sensor 127 (Step 1). If the inside pressure P increases beyond the predetermined pressure $P_O$ due to a failure in load locking of the mask pre-chamber 116 or the wafer pre-chamber 109 or due to a failure in pressure adjustment in the exposure chamber 113 or, alternatively, if water leakage is detected, then the control device 129 operates to close the shutoff valve 130 and the pump valve 124 (step S2) and operates subsequently to open the communication valve 123 to down the exposure chamber 113. After this, it operates to actuate the display device (not shown) to provide a display of occurrence of abnormality (malfunction) in the exposure chamber 113 (step S3).

By closing the shutoff valve 130 before the inside pressure P increases to the proof pressure $P_L$ of the window member 107, at least it is possible to prevent scatter of fractions of the window member 107 toward the upstream side of the beam line 103. Also, by opening the communication valve 123 before the pressure P increases up to the proof pressure $P_L$ of the window member 107, it is possible to prevent the application of the pressure to the window member 107. Thus, it is possible to avoid damage of the window member 107.

FIG. 4B is a flow chart showing the operation of the control device 129 to be executed at the time of re-start of the exposure operation after repair of leakage at the exposure chamber 113.

Upon re-start of the apparatus, the control device 129 operates to execute vacuum-evacuation of the inside of the exposure chamber 113 through the vacuum-evacuation means provided for the exposure chamber 113. This operation is continued until the pressure P as detected by the pressure sensor 117 becomes lower than a predetermined pressure $P_A$ (which is about $10^{-3}$ torr) (step S4). If a relationship $P<P_A$ is established, the communication valve 123 is closed (step S5). Then, the pump valve 124 is opened while, on the other hand, the introduction of helium gas into the exposure chamber 113 is started, through the gas introducing means provided for the exposure chamber 113 (step S6). After this, discrimination is made (step S7) as to whether the pressure P detected by the pressure sensor 121 is lower than the vacuum level ($10^{-7}$ torr) as required to be established in the beam line 103 at the time of exposure. Additionally, discrimination is made (step S8) as to whether the inside ambience of the exposure chamber 113 is suited for the exposure process. After it is discriminated, the shutoff valve 130 is opened (step S9).

With these operations, it is possible to prevent entrance of the helium gas into the beam line 103 and, therefore, it is possible to re-start the exposure operation smoothly.

Figure 5:
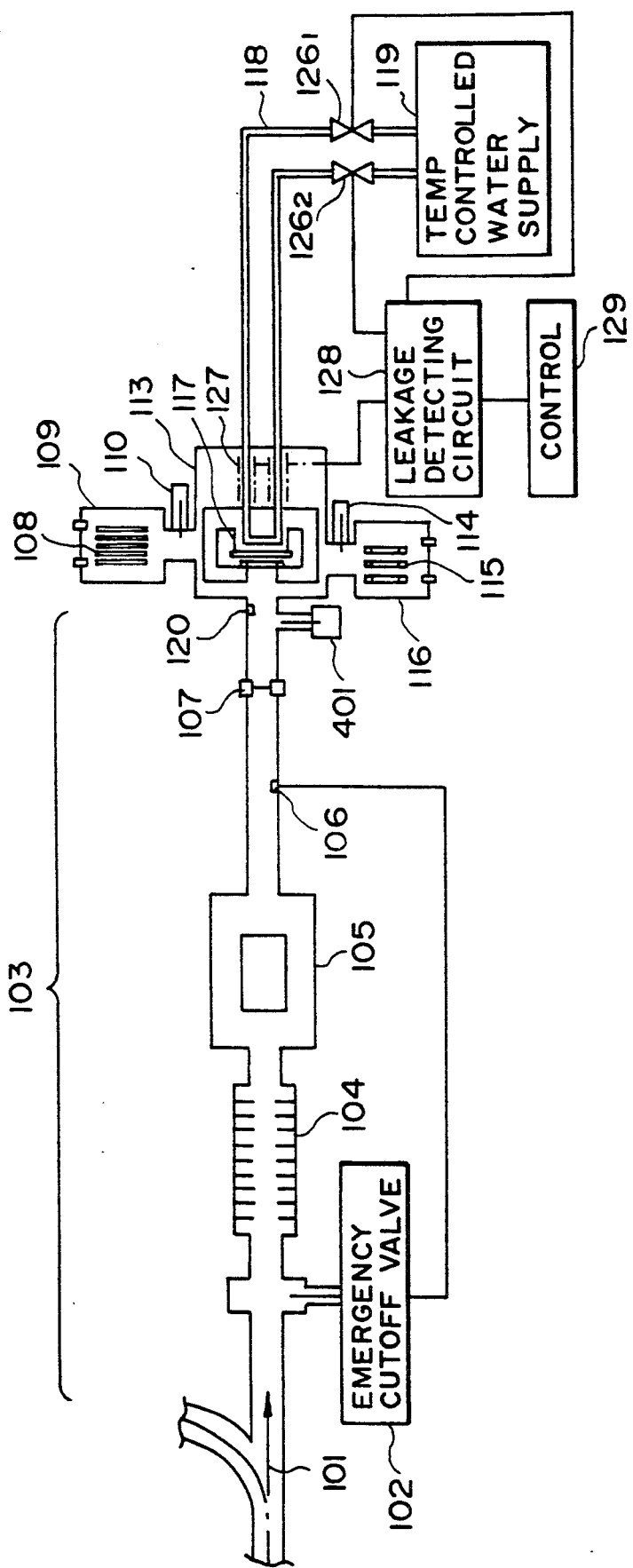
FIG. 5 is a schematic and diagrammatic view of an X-ray exposure apparatus according to a further embodiment of the present invention.

FIG. 5 illustrates the structure of a further embodiment of the present invention. In this embodiment, the structure of the FIG. 2 embodiment is simplified and, on the other hand, a shutoff valve 401 is added. Like numerals as those of FIG. 2A are assigned to corresponding components, and description thereof will be omitted here.

In this embodiment, each of the shutoff valve 130, the by-pass passageway 122, the communication valve 123, the pump valve 124 and the vacuum pump 125 of the FIG. 2A embodiment is omitted. On the other hand, a shutoff valve 401 which is controlled by the control device 129 is disposed between the window member 107 and the pressure sensor 120.

When the pressure P as detected by the pressure sensor 120 increases beyond a predetermined pressure $P_O$ or, alternatively, when water leakage is detected by the water leakage sensor 127, the control device 129 operates to close the shutoff valve 401 to prevent additional pressure application to the window member 107, to thereby avoid damage of the window member 107.

In a further embodiment of the present invention, a combined form of the FIG. 2 embodiment and the FIG. 5 embodiment is possible. This corresponds to that, in the embodiment shown in FIG. 2A, a shutoff valve such as at 401 in FIG. 4 is added and disposed between the exposure chamber 113 and a portion of the by-pass passageway 122, being communicated with the exposure chamber 113 side.

The operation of the control device 129 on that occasion may be substantially the same as that of the embodiment shown in FIGS. 3A and 3B, and the opening and closing motion of the shutoff valve 130 may be operationally associated with the opening and closing motion of the shutoff valve 401. This avoids the possibility of pressure application to the window member 107 due to the leakage, after closure of the shutoff valves 130 and 401, and it enhances the safety.

While in some embodiments the water leakage sensor has been described as a sensor of the type wherein water leakage is detected on the basis of a change in the resistance between electrodes, the water leakage sensor is not limited thereto and, for example, a relative hygrometer or a moisture meter may be used to detect the water leakage.

In accordance with these embodiments of the present invention, as described hereinbefore, the following advantageous effects are obtainable.

Since pressure leakage or water leakage at the exposure chamber can be detected at an early stage, it is possible to avoid damage of the window member and entrance of the gas of the exposure chamber into the synchrotron radiation device. Particularly when water leakage occurs, a suitable protection can be taken before the pressure actually increases. Thus, there is a significant advantageous effect.

While the invention has been described with reference to the structures disclosed herein, it is not confined to the details set forth and this application is intended to cover such modifications or changes as may come within the purposes of the improvements or the scope of the following claims.

What is claimed is:

1. A combination for use in an X-ray exposure apparatus having a synchrotron radiation device for producing a synchrotron radiation beam and an exposure chamber coupled to said synchrotron radiation device through a beam line, wherein the synchrotron radiation beam is inputted to said exposure chamber through a window provided across said beam line, for execution of an exposure process in said exposure chamber and wherein a temperature controlling water passageway for temperature control is provided adjacent a heat generating portion of said exposure chamber, the combination comprising:

pressure detecting means for detecting pressure in said exposure chamber;

a shutoff valve provided in a portion of said beam line between said window and said synchrotron radiation device;

bypass means having a communication valve for communicating a portion of said beam line between said window and said shutoff valve with another portion of said beam line between said window and said exposure chamber;

vacuum-evacuating means for vacuum-evacuating a portion of said beam line between said window and said shutoff valve;

a pump valve provided in a passageway which communicates said beam line with said vacuum-evacuating means;

a leakage sensor for detecting leakage at said temperature controlling water passageway; and a control device operable in response to the pressure detected by said pressure detecting means so that, when the detected pressure in the exposure process is at a steady state level lower than a predetermined pressure, said control device operates to open said shutoff valve and said pump valve and to close said communication valve while, when the detected pressure in the exposure process is higher than said predetermined pressure or when said leakage sensor detects the leakage, said control device operates to close said shutoff valve and said pump valve and then to open said communication valve.

2. A combination according to claim 1, further comprising a second shutoff valve provided in a portion of said beam line between said window and said exposure chamber, wherein the opening and closing of said second shutoff valve is controlled in the same manner as in the first-mentioned shutoff valve provided in the portion of said beam line between said window and said synchrotron radiation device.

3. A combination for use in an X-ray exposure apparatus having a synchrotron radiation device for producing a synchrotron radiation beam and an exposure chamber coupled to said synchrotron radiation device through a beam line, wherein the synchrotron radiation beam is inputted to said exposure chamber through a window provided across said beam line, for execution of an exposure process in said exposure chamber and wherein a temperature controlling water passageway for temperature control is provided adjacent a heat generating portion of said exposure chamber, the combination comprising:
pressure detecting means for detecting pressure in said exposure chamber;
a shutoff valve provided in a portion of said beam line between said window and said synchrotron radiation device;
a leakage sensor for detecting leakage at said temperature controlling water passageway; and
a control device operable in response to the pressure detected by said pressure detecting means so that, when the detected pressure in the exposure process is at a steady state level lower than a predetermined pressure, said control device operates to open said shutoff valve while, when the detected pressure in the exposure process is higher than said predetermined pressure or when said leakage sensor detects the leakage, said control device operates to close said shutoff valve.

4. An exposure apparatus comprising:
a chamber for placing an article within a predetermined reduced pressure ambience;
a holder for holding the article within said chamber, for exposure of the article with radiation;
temperature controlling liquid medium supplying means disposed outside said chamber;
a flow passageway for guiding a temperature controlling liquid medium into said chamber from said supplying means and for guiding the liquid medium beside said holder and out of said chamber;
an openable/closable valve disposed outside said chamber, for adjusting the flow rate of the liquid medium through said passageway;
moisture detecting means for detecting moisture in said chamber; and
control means for controlling the opening/closing of said valve on the basis of the detection by said moisture detecting means.

5. An apparatus according to claim 4, wherein the liquid medium contains water and wherein said moisture detecting means comprises a water content detecting sensor.

6. An apparatus according to claim 4, wherein said control means comprises means for closing said valve in response to detection of a rise in moisture by said detecting means.

7. An exposure apparatus comprising:
a chamber for placing an article within a predetermined reduced pressure ambience;
a holder for holding the article within said chamber, for exposure of the article with radiation;
temperature controlling liquid medium supplying means disposed outside said chamber;
a flow passageway for guiding a temperature controlling liquid medium into said chamber from said supplying means and for guiding the liquid medium beside said holder and out of said chamber;
an openable/closable valve disposed outside said chamber, for adjusting the flow rate of the liquid medium through said passageway;
leakage detecting means provided in said chamber, for detecting leakage of the liquid medium from said passageway into said chamber; and
control means for controlling the opening/closing of said valve on the basis of the detection by said leakage detecting means.

8. A control method for use in a semiconductor device manufacturing exposure apparatus for exposing a wafer with radiation, said method comprising:
placing a wafer on a wafer holder within a chamber filled with a predetermined reduced pressure ambience;
guiding a temperature controlling liquid medium along a portion of a flow passageway into the chamber from outside the chamber;
guiding the liquid medium along another portion of the flow passageway beside the wafer holder and out of the chamber;
detecting leakage of the liquid medium into the chamber by using a detector provided in the chamber; and
closing an openable/closable valve, provided outside the chamber for adjustment of the flow rate of the liquid medium through the passageway, in response to detection of leakage by the detector.

9. A method according to claim 8, wherein the liquid medium contains water, and further comprising detecting the leakage by using one of a hygrometer and a water content detector.

* * * * *

UNITED STATES PATENT AND TRADEMARK OFFICE
CERTIFICATE OF CORRECTION

PATENT NO. : 5,138,643
DATED : August 11, 1992
INVENTOR(S) : Eiji Sakamoto, et al.

It is certified that error appears in the above-identified patent and that said Letters Patent is hereby corrected as shown below:

COLUMN 2

Line 24, "mask 515" should read --mask 512--;
Line 28, "wafer 511," should read --wafer 508--; and
Line 33, "sensor 512" should read --sensor 506--.

COLUMN 6

Line 6, "water" should read --wafer--;
Line 28, "mask 115" should read --mask 112--;
Line 31, "wafer 111" should read --wafer 108--; and
Line 37, "sensor 112" should read --sensor 106--.

COLUMN 7

Line 3, "valve" should read --valves--.

Signed and Sealed this

Twelfth Day of October, 1993

Attest:

BRUCE LEHMAN

Attesting Officer

Commissioner of Patents and Trademarks